US008559089B2

(12) United States Patent
Kubo et al.

(10) Patent No.: US 8,559,089 B2
(45) Date of Patent: Oct. 15, 2013

(54) OPTICAL SCANNER

(75) Inventors: Naoki Kubo, Takarazuka (JP);
Masayuki Ueyama, Takarazuka (JP)

(73) Assignee: Konica Minolta Opto, Inc., Tokyo (JP)

( * ) Notice: Subject to any disclaimer, the term of this patent is extended or adjusted under 35 U.S.C. 154(b) by 377 days.

(21) Appl. No.: 13/120,203

(22) PCT Filed: Sep. 24, 2009

(86) PCT No.: PCT/JP2009/066557
§ 371 (c)(1),
(2), (4) Date: Mar. 22, 2011

(87) PCT Pub. No.: WO2010/035759
PCT Pub. Date: Apr. 1, 2010

(65) Prior Publication Data
US 2011/0181933 A1    Jul. 28, 2011

(30) Foreign Application Priority Data

Sep. 25, 2008   (JP) ................................ 2008-245925

(51) Int. Cl.
*G02B 26/08*    (2006.01)
(52) U.S. Cl.
USPC ................ 359/224.1; 359/199.1; 359/199.4; 359/200.7
(58) Field of Classification Search
USPC .......... 359/198.1–199.4, 200.6–200.8, 221.2, 359/224.1–224.2
See application file for complete search history.

(56) References Cited

U.S. PATENT DOCUMENTS

| 8,072,664 | B1 * | 12/2011 | Ma et al. | 359/199.4 |
|---|---|---|---|---|
| 2005/0184351 | A1 | 8/2005 | Fu | |
| 2006/0203326 | A1 | 9/2006 | Fu | |
| 2007/0146858 | A1 | 6/2007 | Matsuda | 359/224 |
| 2007/0268544 | A1 | 11/2007 | Ueyama | 359/225 |
| 2007/0291343 | A1 | 12/2007 | Kato et al. | 359/198 |
| 2008/0198433 | A1 | 8/2008 | Ueyama | |

FOREIGN PATENT DOCUMENTS

| CN | 101086555 A | 12/2007 |
|---|---|---|
| EP | 1 865 358 A1 | 12/2007 |
| JP | 2005-148459 A | 6/2005 |
| JP | 2007-199682 A | 8/2007 |
| JP | 2007-310196 A | 11/2007 |
| JP | 2008-020701 A | 1/2008 |
| JP | 2008-203299 A | 9/2008 |
| JP | 2008-254162 A | 10/2008 |
| JP | 2009-098253 A | 5/2009 |
| KR | 10-2007-0117487 A | 12/2007 |
| WO | WO 2010/035759 A1 | 4/2010 |

OTHER PUBLICATIONS

EPO Search Report issued on Mar. 14, 2012 in the corresponding European application, No. EP 09 81 6174.

* cited by examiner

*Primary Examiner* — James Phan
(74) *Attorney, Agent, or Firm* — Cozen O'Connor

(57) ABSTRACT

An optical scanner capable of preventing breakage of a shaft section due to stress concentration is provided. A mirror frame 13 is shaped so as to enclose a mirror 11, and holds the mirror 11, via torsion bars 121 and 122, so as to be vibratable. A unimorph 15 is constituted by four unimorphs 151, 152, 153, and 154 formed on upper left, lower left, upper right, and lower right sides, and holds the mirror frame 13, via a shaft section 14, so as to be vibratable. The shaft section 14 has a connection section 144. On the mirror frame 13, an adjustment member 16 for increasing a moment of inertia m1 of the mirror frame 13 is provided.

8 Claims, 6 Drawing Sheets

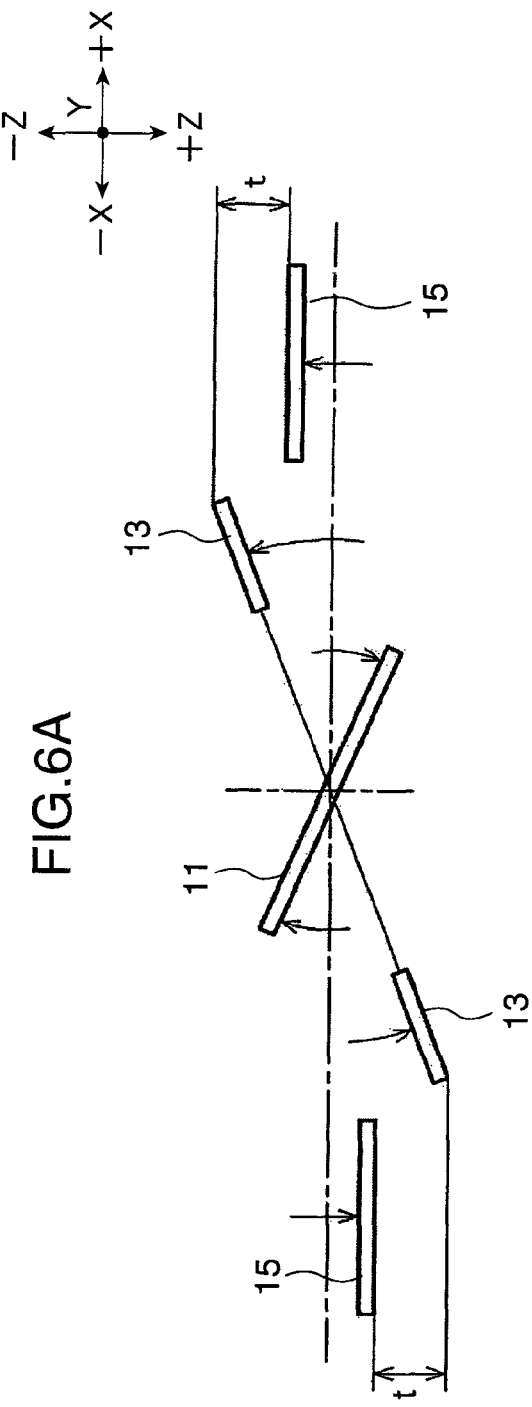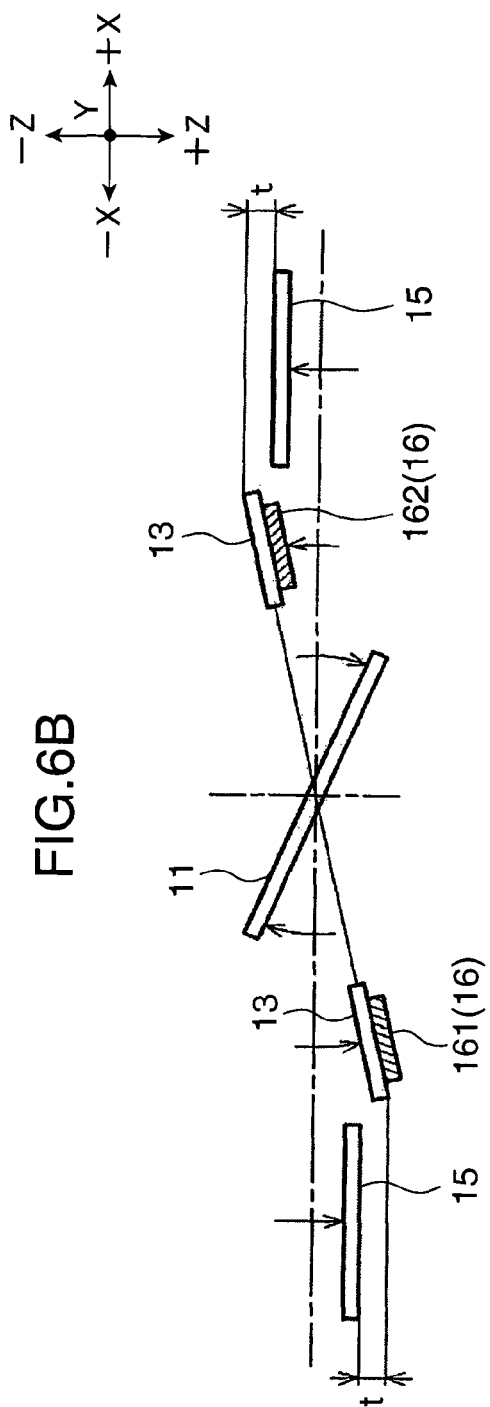

OPTICAL SCANNER

RELATED APPLICATIONS

This is a U.S. National Stage under 35 U.S.C. §371 of International Application No. PCT/JP2009/066557, filed in the Japanese Patent Office on Sep. 24, 2009, which claims priority on Japanese Patent Application No. 2008-245925, filed on Sep. 25, 2008.

TECHNICAL FIELD

The present invention relates to an optical scanner and, particularly, to an MEMS (Micro Electro Mechanical Systems) optical scanner.

BACKGROUND ART

MEMS optical scanners that simultaneously scan light biaxially in a main scanning direction and a sub scanning direction perpendicular to the main scanning direction have recently been developed. For example, Patent Document 1 discloses an optical scanner which is intended to significantly increase an angle of deflection and which comprises a mirror surface that reflects light, a main shaft section that pivotally supports the mirror surface, and a deformable holding section (actuator) that holds the main shaft section.

This optical scanner is configured such that a torsion bar (flexible section), which changes a deformation of the holding section itself into a torsional deformation, is formed in the holding section and the mirror surface pivotally moves using a torsional deformation generated at the torsion bar (flexible section). In particular, the optical scanner according to Patent Document 1 illustrated in FIG. 9 comprises a movable frame (mirror frame) that encloses the mirror surface, and by deforming the holding section, the optical scanner becomes capable of biaxial scanning.

However, with the optical scanner according to Patent Document 1, providing the torsion bar (flexible section) between the holding section (actuator) and the movable frame in order to increase vertical displacement makes stress more likely to concentrate at the torsion bar (flexible section) during horizontal driving and creates a risk of damage to the torsion bar (flexible section). Therefore, there is a limit to increasing a horizontal angle of deflection.

Patent Document 1: Japanese Patent Application Laid-Open No. 2008-203299

SUMMARY OF THE INVENTION

An object of the present invention is to provide an optical scanner capable of alleviating stress acting on a connection unit of an actuator and a mirror frame without reducing a horizontal angle of deflection of a mirror surface.

An optical scanner according to an aspect of the present invention comprises: a mirror; a first shaft section; a mirror frame that holds the mirror via the first shaft section; a second shaft section that holds the mirror frame; and an actuator that vibrates the mirror around the first and second shaft sections by vibrating the mirror frame via the second shaft section, wherein the second shaft section includes a deformable connection unit and is connected to the actuator via the connection unit, and the mirror frame includes an adjustment member for adjusting moment of inertia.

BRIEF DESCRIPTION OF THE DRAWINGS

FIG. 4 are diagrams illustrating an effect of a connection section, wherein

FIG. 6 illustrates diagrams of the optical scanner illustrated in FIG. 1 as seen in a −Y direction, wherein (A) illustrates a case where an adjustment member is not provided on a mirror frame and (B) illustrates a case where an adjustment member is provided on the mirror frame.

BEST MODE FOR CARRYING OUT THE INVENTION

Figure 1:
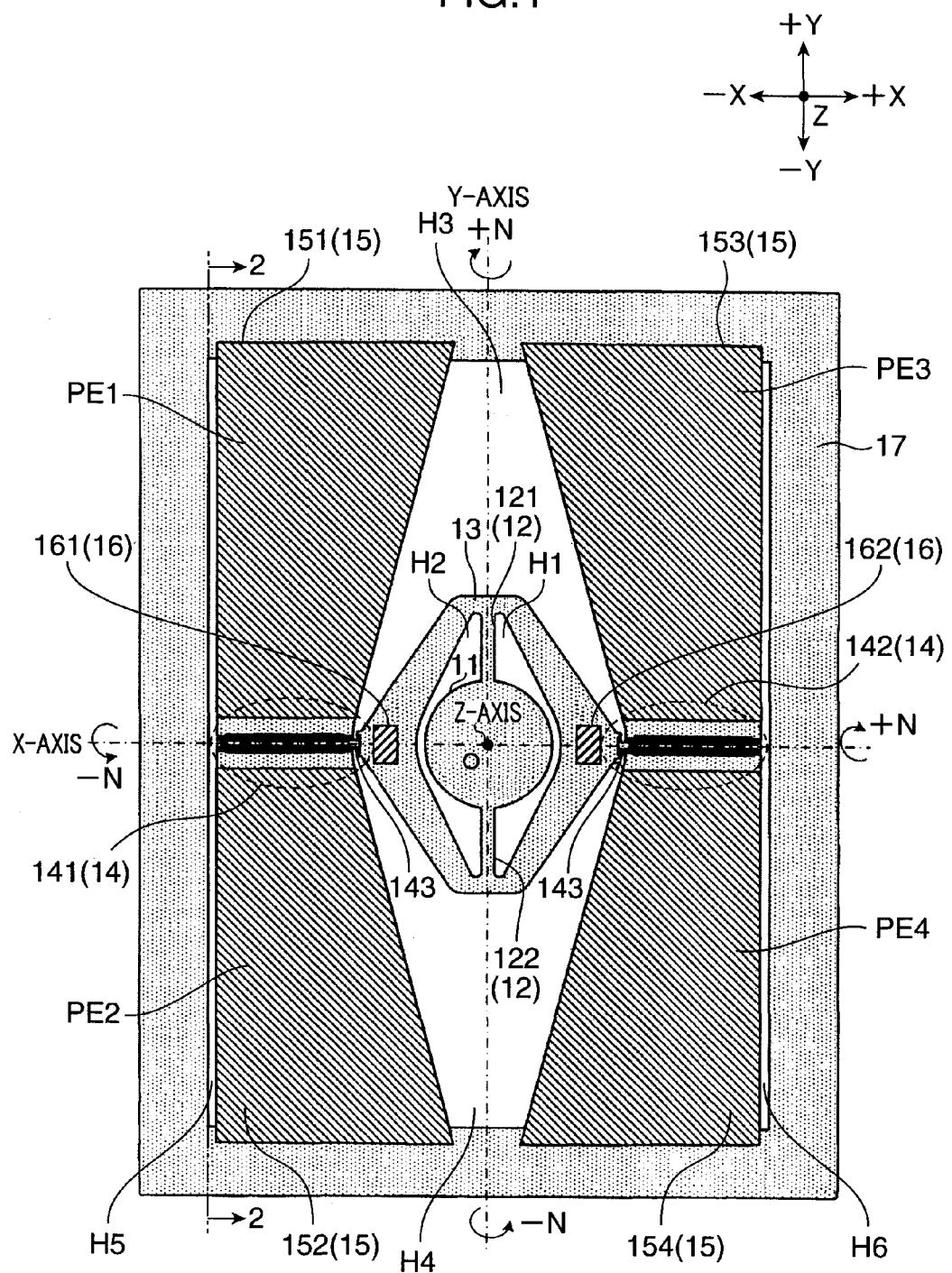
FIG. 1 is an overall configuration diagram of an optical scanner according to an embodiment of the present invention.
Figure 2:
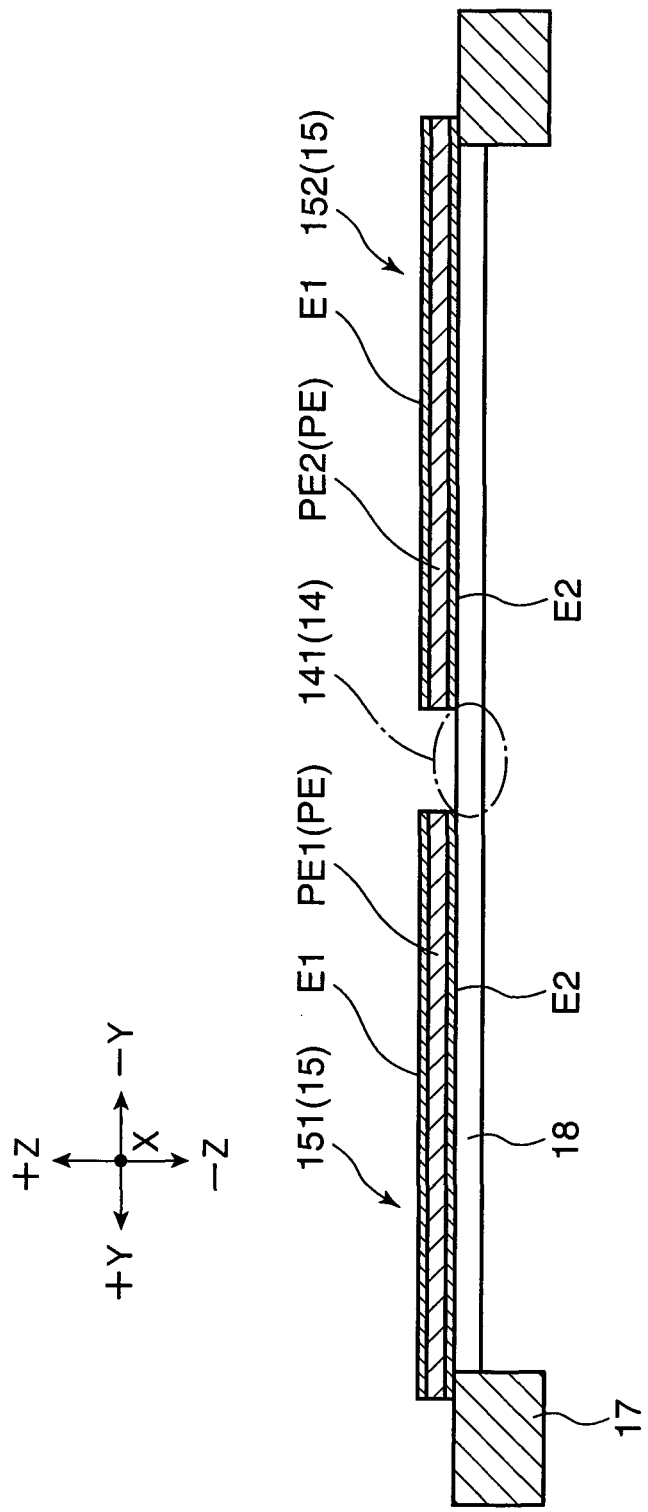
FIG. 2 is a cross-sectional view of the optical scanner illustrated in FIG. 1 taken from a 2-2 direction.

Hereinafter, an optical scanner according to an embodiment of the present invention will be described. FIG. 1 is an overall configuration diagram of the present optical scanner. FIG. 2 is a cross-sectional view of the optical scanner illustrated in FIG. 1 taken from a 2-2 direction.

The present optical scanner is a MEMS optical scanner and comprises a mirror 11, a torsion bar (an example of a first shaft section) 12, a mirror frame 13, a shaft section 14 (an example of a second shaft section), a unimorph (an example of an actuator) 15, and an outer frame 17. In FIG. 1, vertical directions are represented by a Y-axis, horizontal directions are represented by an X-axis, and directions perpendicular to the plane of paper are represented by a Z-axis. In addition, it is assumed that the Y-axis is positioned in a longitudinal direction of the torsion bar 12 and the X-axis passes through a center O of the mirror 11 and is positioned in a longitudinal direction of the shaft section 14. Furthermore, the X-axis, the Y-axis, and the Z-axis are respectively perpendicular to each other.

The mirror 11 has a circular shape as seen in a −Z direction, and has a thin film made of aluminum or the like formed on a +Z direction-side surface for reflecting light from a light source or the like and scanning light in a horizontal scanning direction and a vertical scanning direction.

Upper and lower torsion bars 12 are provided as a pair and have elongated shapes whose longitudinal direction is parallel to the Y-axis. Hereinafter, the torsion bar formed on a +Y direction-side will be referred to as a torsion bar 121 and the torsion bar formed on a −Y direction-side will be referred to as a torsion bar 122. Moreover, the longitudinal lengths of the torsion bars 121 and 122 are approximately the same.

The mirror frame 13 holds the mirror 11 via the torsion bars 121 and 122 so as to be vibratable. The mirror frame 13 has an approximate rhombic shape whose outer circumference is left-right symmetrical about the Y-axis and up-down symmetrical about the X-axis, and is shaped so as to enclose the mirror 11. The weight of the mirror frame 13 is left-right symmetrical about the Y-axis and up-down symmetrical about the X-axis.

Left and right shaft sections 14 are provided as a pair, and as illustrated in FIG. 2, each of the shaft sections 14 is constituted by a region at a central part of a base section 18 as seen in a +X direction. In this case, the base section 18 is a flexible plate-like member formed at a lower layer of a piezoelectric element PE that comprises a unimorph 15. Upon receiving a vibration force from the unimorph 15, the shaft section 14 deflects the mirror frame 13 in a +N direction or a −N direction around the X-axis and vibrates the mirror frame 13.

Moreover, as illustrated in FIG. 1, the shaft section 14 positioned on the left side will be referred to as a shaft section 141 and the shaft section 14 positioned on the right side will be referred to as a shaft section 142.

Figure 3:
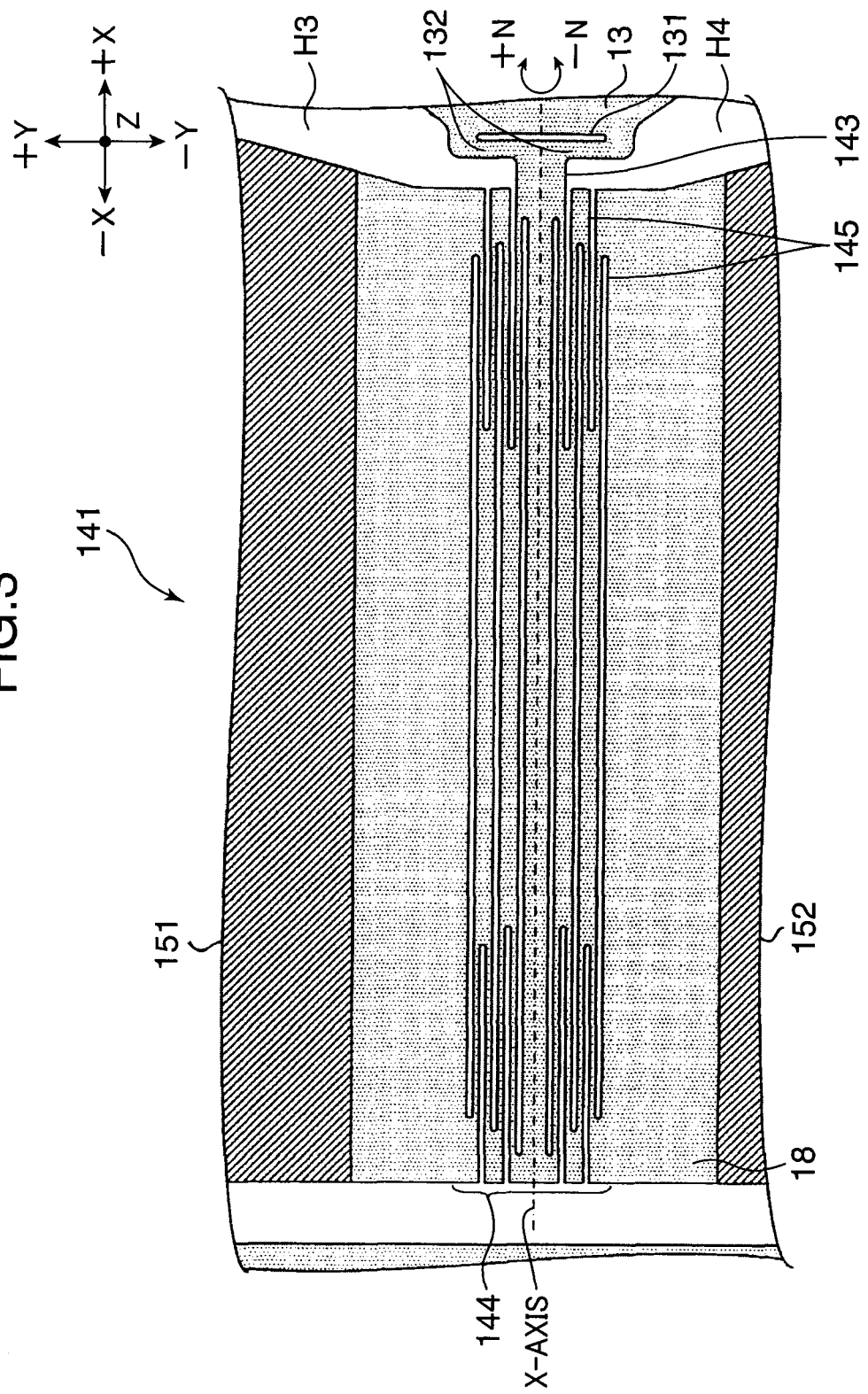
FIG. 3 is an enlarged view of a shaft section.

FIG. 3 is an enlarged view of the shaft section 141. The shaft section 141 comprises a main shaft section 143 and a connection section 144. The connection section 144 is configured so as to be deformable by forming a plurality of slits 145 whose longitudinal direction is the X-axis direction on the base section 18. The respective slits 145 are arranged so as to be up-down symmetrical about, for example, the X-axis. Accordingly, the flexibility of the shaft section 141 is arranged so as to be up-down symmetrical about the X-axis. The main shaft section 143 extends along the X-axis from the base section 18 to the mirror frame 13 and connects the mirror frame 13 with the connection section 144. In the present embodiment, the connection section 144 provided on the shaft section 141 corresponds to an example of a left-side connection section and the connection section 144 provided on the shaft section 142 corresponds to an example of a right-side connection section. In addition, the pair of the left and right connection sections 144 corresponds to an example of a connection unit.

Figure 4A:
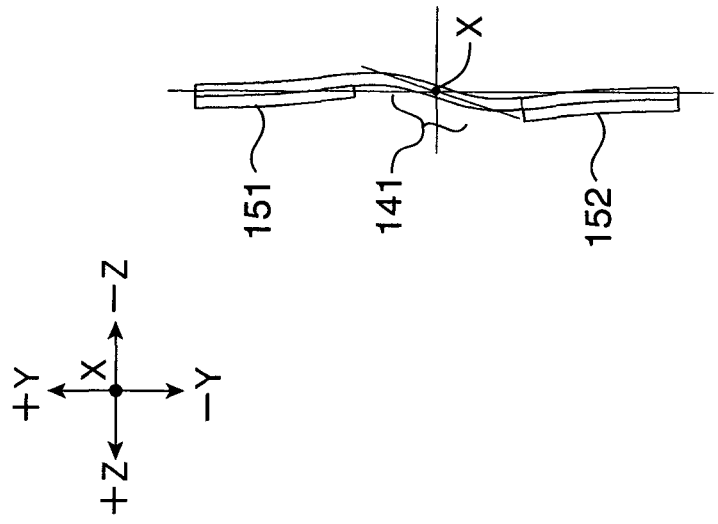
FIG. 4(A) illustrates a case where the connection section is provided and FIG. 4(B) illustrates a case where the connection section is not provided.
Figure 4B:
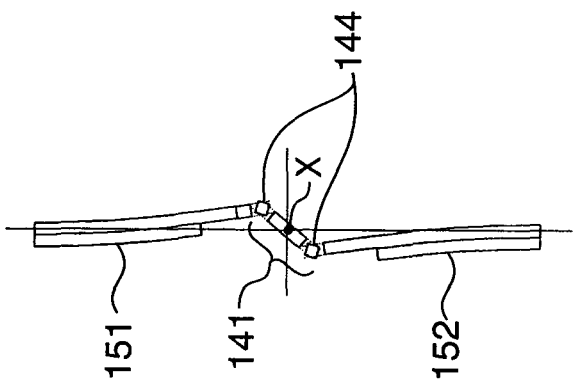

In this case, since the shaft section 141 comprises the connection section 144, this shaft section is more likely to bend around the X-axis and is capable of greatly inclining the unimorphs 151 and 152 and increasing the angle of deflection of the mirror frame 13. FIG. 4 are diagrams illustrating an effect of the connection section 144, wherein FIG. 4(A) illustrates a case where the connection section 144 is provided on the shaft section 141 and FIG. 4(B) illustrates a case where the connection section 144 is not provided on the shaft section 141. Note that FIG. 4(A) and FIG. 4(B) illustrate the optical scanner as seen in the −X direction.

When the connection section 144 is not provided on the shaft section 141 as illustrated in FIG. 4(B), the shaft section 141 is not flexible and the unimorphs 151 and 152 are less likely to bend. Therefore, an angle of deflection of the mirror frame 13 around the X-axis decreases and the mirror 11 cannot deflect greatly around the X-axis.

On the other hand, when the connection section 144 is provided on the shaft section 141 as illustrated in FIG. 4(A), the shaft section 141 becomes flexible and the unimorphs 151 and 152 are more likely to bend around the X-axis. Therefore, even when the same force as FIG. 4(B) is applied, an angle of deflection of the mirror frame 13 around the X-axis increases and the mirror 11 deflects greatly around the X-axis.

Moreover, a slit 131 perpendicular to the X-axis is formed on the mirror frame 13 in the vicinity of a connection point with the main shaft section 143. Therefore, a torsion bar 132 having the Y-axis direction as its longitudinal direction is formed in the vicinity of the connection point of the mirror frame 13 with the main shaft section 143. As a result, a portion between the mirror frame 13 and the main shaft section 143 is more likely to bend, and when the mirror frame 13 is deflected around the Y-axis, stress acting on the shaft section 141 is alleviated, thereby preventing damage to the shaft section 141.

Since the shaft section 142 illustrated in FIG. 1 shares the same structure as the shaft section 141, a description thereof will be omitted.

As illustrated in FIG. 1, the unimorph 15 is constituted by four unimorphs 151, 152, 153, and 154 formed on upper left, lower left, upper right, and lower right sides, and holds the mirror frame 13 via the shaft section 14 so as to be vibratable. Specifically, as illustrated in FIG. 2, the unimorph 15 is configured by forming a piezoelectric element PE on an upper surface of the flexible base section 18. In addition, an electrode E1 is formed on a surface of the piezoelectric element PE, and an electrode E2 is formed on a base section 18 side of the piezoelectric element PE. The piezoelectric elements PE constituting the unimorphs 151 to 154 will be denoted as piezoelectric elements PE1 to PE4.

+Y direction-side ends of the piezoelectric elements PE1 and PE3 are placed on a part of an upper outer frame 17 illustrated in FIG. 1, and −Y direction-side ends of the piezoelectric elements PE2 and PE4 are placed on a part of a lower outer frame 17 illustrated in FIG. 1.

By applying a voltage with a positive or negative polarity between the electrode E1 and the electrode E2 within a range which does not cause polarization inversion, the unimorph 15 can be extended or shortened.

Specifically, for example, when a voltage of a positive polarity is applied and the piezoelectric element PE is extended, the unimorph 15 inclines toward the −Z direction-side, and when a voltage of a negative polarity is applied and the piezoelectric element PE is shortened, the unimorph 15 inclines toward the +Z direction-side.

Therefore, when extending the piezoelectric elements PE1 and PE3 and shortening the piezoelectric elements PE2 and PE4, the unimorphs 151 and 153 incline toward the −Z direction-side and the unimorphs 152 and 154 incline toward the +Z direction-side.

On the other hand, when shortening the piezoelectric elements PE1 and PE3 and extending the piezoelectric elements PE2 and PE4, the unimorphs 151 and 153 incline toward the +Z direction-side and the unimorphs 152 and 154 incline toward the −Z direction-side.

Therefore, by interchanging the polarity of the voltage applied to the piezoelectric elements PE1 and PE3 and the polarity of the voltage applied to the piezoelectric elements PE2 and PE4, the unimorphs 151 to 154 can be vibrated around the X-axis. Upon receiving this vibration force, the mirror frame 13 and the mirror 11 vibrate around the X-axis.

In addition, when extending the piezoelectric elements PE1 and PE2 and shortening the piezoelectric elements PE3 and PE4, the unimorphs 151 and 152 incline toward the −Z direction-side and the unimorphs 153 and 154 incline toward the +Z direction-side.

On the other hand, when shortening the piezoelectric elements PE1 and PE2 and extending the piezoelectric elements PE3 and PE4, the unimorphs 151 and 152 incline toward the +Z direction-side and the unimorphs 153 and 154 incline toward the −Z direction-side.

Therefore, by interchanging the polarity of the voltage applied to the piezoelectric elements PE1 and PE2 and the polarity of the voltage applied to the piezoelectric elements PE3 and PE4, the unimorphs 151 to 154 can be vibrated around the Y-axis. Accompanying this vibration, the mirror frame 13 and the mirror 11 vibrate around the Y-axis.

The mirror 11 and the mirror frame 13 can be vibrated in the same phase or in opposite phases around the Y-axis. In this case, the same phase represents that when the mirror frame 13 is deflected in the +N direction around the Y-axis, the mirror 11 deflects in the +N direction around the Y-axis, and opposite phases represent that when the mirror frame 13 is deflected in the +N direction around the Y-axis, the mirror 11 deflects in the −N direction around the Y-axis.

A vibration of the mirror 11 and the mirror frame 13 in the same phase or in opposite phases around the Y-axis can be realized by adjusting dimensions and the like of the respective members comprising the optical scanner. Moreover, an experiment result shows that vibrating the mirror 11 and the mirror frame 13 in opposite phases around the Y-axis can increase the angle of deflection of the mirror 11 by a greater degree than vibrating the mirror 11 and the mirror frame 13 in the same phase. Therefore, in the present embodiment, the mirror 11 and the mirror frame 13 are vibrated in opposite phases around the Y-axis.

Furthermore, in the present embodiment, while the optical scanner is designed such that an angle of deflection of the mirror frame 13 about the Y-axis is smaller than an angle of deflection about the X-axis, by vibrating the mirror frame 13 at a resonant frequency of the mirror 11 and the mirror frame 13 when the mirror frame 13 is vibrated around the Y-axis as a rotational axis, the mirror 11 can be deflected at a relatively large angle of deflection.

Moreover, while the optical scanner according to the present embodiment is intended to be mounted on a laser scanning projector, the resonant frequency has a value in the order of, for example, kHz that is a frequency of laser light in a horizontal scanning direction. On the other hand, the frequency of the mirror frame 13 in the X-axis direction has a value in the order of Hz that is a frequency of laser light in a vertical scanning direction.

Therefore, since vibrations around the X-axis have a frequency in the vertical scanning direction of several 10 Hz and an acceleration acting on the mirror frame 13 is not significantly large, stress acting on the connection section 144 in this case is relatively small.

On the other hand, since vibrations around the Y-axis have a frequency in the horizontal scanning direction of several 10 kHz and a significantly large acceleration acts on the mirror frame 13, stress acting on the connection section 144 in this case is significantly large. As a result, a problem arises in that a breakage of the connection section 144 occurs.

In addition, when an amplitude of the unimorph 15 is increased in order to increase an angle of view in the horizontal scanning direction, the stress acting on the connection section 144 further increases and creates a risk of a breakage occurring at the connection section 144 despite the slit 131 being provided on the mirror frame 13, thereby making it difficult to obtain a large angle of deflection.

In consideration thereof, with the present optical scanner, an adjustment member 16 constituted by, for example, a weight for adjusting a moment of inertia of the mirror frame is provided on the mirror frame 13. Accordingly, the moment of inertia of the mirror frame 13 is increased in the Y-axis direction without having to increase the area of the mirror frame 13, a difference in maximum displacements between the mirror frame 13 and the unimorph 15 is reduced even when increasing the amplitude of the unimorph 15, and stress acting on the connection section 144 can be alleviated. Moreover, while increasing the area of the mirror frame 13 similarly increases the moment of inertia, a viscous resistance of the mirror frame 13 increases, making it difficult to vibrate the mirror frame 13 at high speed.

Left and right adjustment members 16 about the Y axis are provided as a pair. The adjustment member 16 provided on the left side will be denoted as an adjustment member 161 and the adjustment member 16 provided on the right side will be denoted as an adjustment member 162. The adjustment members 161 and 162 are arranged on positions of the mirror frame 13 on the X axis separated from the Y axis by the same distance in the X-axis direction.

The outer frame 17 is a frame body with a rectangular shape as seen in the −Z direction, and is formed by etching a semiconductor substrate and encloses the unimorph 15.

Next, the reason for a decrease in the difference in maximum displacements between the unimorph 15 and the mirror frame 13 by increasing a moment of inertia m1 of the mirror frame 13 will now be described.

Figure 5:
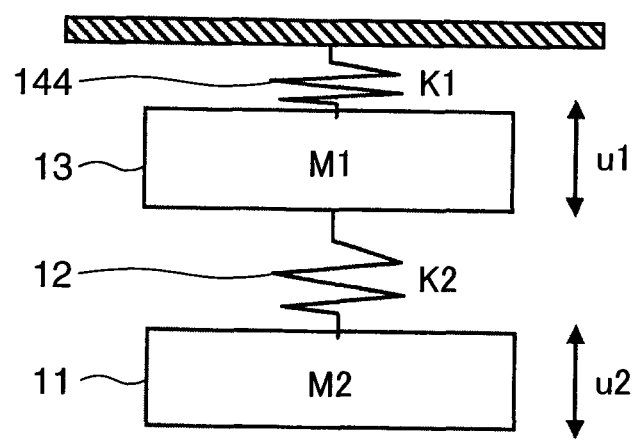
FIG. 5 is a diagram illustrating a dynamic model of the optical scanner illustrated in FIG. 1 when the optical scanner is vibrated around a Y-axis.

FIG. 5 is a diagram illustrating a dynamic model of the optical scanner illustrated in FIG. 1 when the optical scanner is vibrated around the Y-axis. The dynamic model illustrated in FIG. 5 is a two-degree-of-freedom dynamic model, wherein a spring K1 represents the connection section 144, a mass M1 represents the mirror frame 13, a spring K2 represents the torsion bar 12, and a mass M2 represents the mirror 11.

If u1 denotes a displacement of the mirror frame 13 and u2 denotes a displacement of the mirror 11 when vibrated around the Y-axis, then the dynamic model illustrated in FIG. 5 may be expressed by the equation provided as Expression (1).

$$r = \frac{u_2}{u_1} = \frac{k_{11} - m_1 \omega_i^2}{-k_{12}} = \frac{-k_{12}}{k_{22} - m_2 \omega_i^2} \quad (1)$$

r: ratio between u1 and u2
k1: spring coefficient of connection section 144
k2: spring coefficient of torsion bar 12
m1: moment of inertia of mirror frame 13
m2: moment of inertia of mirror 11
ωi: natural frequency
k11=k1+k2
k22=k2
k12=−k2

FIG. 6 is a diagram of the optical scanner illustrated in FIG. 1 as seen in the −Y direction. FIG. 6(A) illustrates a case where the adjustment member 16 is not provided on the mirror frame 13 and FIG. 6(B) illustrates a case where the adjustment member 16 is provided on the mirror frame 13.

In order to alleviate stress concentration to the connection section 144, a difference t between a maximum displacement of the unimorph 15 and a maximum displacement of the mirror frame 13 when vibrated around the Y-axis may be reduced. To this end, r indicated in Expression (1) is to be increased. Accordingly, the displacement u2 of the mirror 11 with respect to the displacement u1 of the mirror frame 13 is increased and the difference t can be reduced.

In Expression (1), it is obvious that in order to increase r, the moment of inertia m1 of the mirror frame 13, the spring coefficient k1 of the connection section 144, and the spring coefficient k2 of the torsion bar 12 may be adjusted. However, since the spring coefficient k2 of the torsion bar 12 and the moment of inertia m2 of the mirror 11 are parameters related to resonant frequency and adjusting the values of these parameters causes a change in the frequency in the horizontal scanning direction, adjusting these values is not favorable.

In addition, since an adjustment of the spring coefficient k1 of the connection section 144 may affect the angle of deflection during vertical scanning, changing the spring coefficient in this way is not favorable. Furthermore, since an adjustment of the moment of inertia m2 of the mirror 11 increases the weight of the mirror 11 and creates a risk that a necessary angle of deflection cannot be obtained, changing the moment of inertia m2 is not favorable. Therefore, it is apparent that the moment of inertia m1 of the mirror frame 13 is favorable as a parameter for increasing r.

In consideration thereof, with the present optical scanner, adjustment members 161 and 162 are provided on the mirror frame 13 as illustrated in FIG. 6(B) so as to increase the moment of inertia m1. Accordingly, the value of r increases, thereby enabling the difference t between the maximum displacement of the unimorph 15 and the maximum displacement of the mirror frame 13 to be reduced without reducing the angle of deflection of the mirror. Therefore, the stress acting on the connection section 144 can be alleviated even when a large voltage is applied by the unimorph 15 to increase the angle of deflection of the mirror 11. As a result, the mirror 11 can be greatly deflected around the Y-axis and an angle of view in the horizontal scanning direction can be increased without damaging the shaft section 14 which is flexibly configured and which is susceptible to stress concentration.

In addition, by positioning the adjustment members 161 and 162 on the X-axis that is a vertical-direction rotational axis, a variance in the moment of inertia m2 of the mirror 11 during vertical scanning in which the mirror frame 13 is vibrated around the X-axis can be reduced, thereby enabling the moment of inertia m1 to be adjusted without adversely affecting vibration during vertical scanning.

The optical scanner configured as described above is manufactured as follows using high-precision processing technology such as etching. A semiconductor substrate with a thickness of around 100 microns and which is constituted by, for example, silicon is processed into a shape including the outer frame 17 illustrated in FIG. 1 and the base section 18 illustrated in FIG. 2. In this case, six holes H1 to H6 illustrated in FIG. 1 and the connection section 144 are formed on the semiconductor substrate. Accordingly, the mirror 11, the torsion bar 12, the mirror frame 13, the outer frame 17, the base section 18, and the like are formed.

In this case, the hole H1 is a hole that demarcates the mirror 11 from the mirror frame 13 and is formed on the right side of the mirror 11. In addition, the hole H2 is a hole that demarcates the mirror 11 from the mirror frame 13 and is formed on the left side of the mirror 11. Furthermore, the hole H3 is a hole that demarcates the mirror frame 13 from the outer frame 17 and is formed on the upper side of the mirror frame 13. Moreover, the hole H4 is a hole that demarcates the mirror frame 13 from the outer frame 17 and is formed on the lower side of the mirror frame 13. In addition, the hole H5 is a hole that demarcates the unimorphs 151 and 152 from the outer frame 17 and is formed on the left side of the unimorphs 151 and 152. Furthermore, the hole H6 is a hole that demarcates the unimorphs 153 and 154 from the outer frame 17 and is formed on the right side of the unimorphs 153 and 154.

Next, a thin film of the piezoelectric element PE is pasted on one surface of the semiconductor substrate. The thin film is etched to form the piezoelectric elements PE1 to PE4. In this case, the adjustment members 161 and 162 are preferably configured using the same material as the piezoelectric elements PE. Accordingly, by abrading the thin film, the adjustment members 161 and 162 can be formed at the same time the piezoelectric elements PE1 to PE4 are formed, thereby enabling the manufacturing process to be simplified and productive efficiency to be improved. Moreover, as the thin film, quartz ($SiO_2$), zinc oxide (ZnO), Rochelle salt (potassium sodium tartrate) ($KNaC_4H_4O_6$), lead zirconate titanate (PZT: $Pb(Zr,Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride, tourmaline, polyvinylidene fluoride (PVDF), and the like can be adopted.

Subsequently, an aluminum thin film is pasted on a surface of the mirror 11 and electrodes are pasted on both surfaces of the piezoelectric element PE.

Moreover, while the adjustment members 161 and 162 are provided on a +Z direction-side surface of the mirror frame 13 in the above description, such an arrangement is not restrictive and the adjustment members 161 and 162 may alternatively be provided on a −Z direction-side surface of the mirror frame 13. Even in this case, the adjustment members 161 and 162 need only be provided on the X-axis at equal distances from the Y-axis. In addition, the adjustment members 161 and 162 may be provided on both the +Z direction-side surface and the −Z direction-side surface of the mirror frame 13. Furthermore, while the number of adjustment members 16 is set to two in the above description, for example, three or more adjustment members can be provided on the mirror frame 13. In this case, the same number of adjustment members is preferably provided on the left side and the right side of the mirror frame 13 so that the weight of the mirror frame 13 is uniformly-distributed with respect to the Y-axis.

In addition, while an example utilizing the unimorph 15 which uses a piezoelectric element as an actuator has been described, an actuator is not limited thereto. For example, the present application can also be applied to an optical scanner arranged such that an actuator is driven by electromagnetic force or electrostatic force.

Furthermore, a part of the mirror frame 13 may be processed so as to be thicker than other parts, whereby the thickened part is may be configured as the adjustment member 16. In this case, since the adjustment member 16 is formed at the same time the mirror frame 13 is processed, productive efficiency can be improved.

The technical features of the optical scanner described above can be summarized as follows.

(1) The optical scanner described above comprises: a mirror; a first shaft section; a mirror frame that holds the mirror via the first shaft section; a second shaft section that holds the mirror frame; and an actuator that vibrates the mirror around the first and second shaft sections by vibrating the mirror frame via the second shaft section, wherein the second shaft section includes a deformable connection unit and is connected to the actuator via the connection unit, and the mirror frame includes an adjustment member for adjusting moment of inertia.

According to this configuration, the mirror that scans light is held by the mirror frame via the first shaft section. The actuator is connected to the mirror frame via the second shaft section. In addition, by vibrating the mirror frame, the actuator vibrates the mirror around the first and second shaft sections.

With the actuator, a deformable connection unit is formed at the second shaft section. Accordingly, the mirror frame deflects more readily around the second shaft section, and by a minute vibration of the actuator, the mirror can be greatly deflected around the second shaft section.

In this case, the actuator vibrates the mirror around the first shaft section in addition to the second axis. Therefore, the vibration creates a problem in that stress concentrates at the connection unit and damages the second shaft section.

In consideration thereof, in the present optical scanner, the adjustment member is provided on the mirror frame. Accordingly, the moment of inertia of the mirror frame can be increased without having to increase the area of the mirror frame, a difference in maximum displacements between the mirror frame and the actuator can be reduced even when increasing the displacement of the mirror, and stress acting on the connection unit can be alleviated. Therefore, breakage of the second shaft section can be prevented.

(2) In the optical scanner described above, preferably, the mirror frame is weighted symmetrically about the first shaft section and the adjustment member is provided such that the mirror frame is weighted symmetrically about the first shaft section.

According to this configuration, displacement of the mirror frame around the first shaft section can be arranged so as to be symmetrical.

(3) In the optical scanner described above, preferably, the direction of the first shaft section is perpendicular to the direction of the second shaft section, and the adjustment member is provided on an extension of the second shaft section.

According to this configuration, a variance in moment of inertia of the mirror during vertical scanning in which the mirror frame is vibrated around the second shaft section can be reduced, thereby enabling the moment of inertia of the mirror to be adjusted without adversely affecting the vibration during vertical scanning.

(4) In the optical scanner described above, preferably, the optical scanner further comprises a base section constituted by a semiconducting material, wherein the actuator is constituted by a unimorph including a thin film of a piezoelectric element pasted on the base section, the adjustment member is constituted by a thin film of the same material as the piezoelectric element, and the mirror, the first shaft section, the mirror frame, and the second shaft section are constituted by the semiconducting material.

According to this configuration, by etching the semiconducting material, the base section, the mirror, the first shaft section, the mirror frame, and the second shaft section can be formed, and by pasting a material for forming a piezoelectric element on surfaces of the base section, the mirror, the first shaft section, the mirror frame, and the second shaft section and etching the material, the piezoelectric element and the adjustment member that constitute the unimorph can be formed. Therefore, the piezoelectric element and the adjustment member that constitute the unimorph can be formed simultaneously and productive efficiency can be improved.

(5) In the optical scanner described above, preferably, a part of the mirror frame is thicker than other parts and the adjustment member is constituted by the part.

According to this configuration, since the adjustment member is formed at the same time the mirror frame is processed, productive efficiency can be improved.

(6) In the optical scanner described above, preferably, the mirror frame is horizontally symmetrical about the first shaft section and vertically symmetrical about the second shaft section, and has a shape that encloses the mirror.

According to this configuration, since the mirror frame is left-right symmetrical and up-down symmetrical and has a shape that encloses the mirror, the mirror frame can be vertically and horizontally vibrated in a well-balanced manner, and the mirror can be vertically and horizontally vibrated in a well-balanced manner.

(7) In the optical scanner described above, preferably, the connection unit comprises a plurality of slits whose longitudinal direction coincides with a longitudinal direction of the second shaft section.

According to this configuration, the connection unit can be arranged so as to be deformable due to a simple configuration of forming a plurality of slits.

(8) In the optical scanner described above, preferably, the optical scanner further comprises an outer frame that encloses the actuator, wherein the connection unit is constituted by a pair of left and right connection sections, with the mirror frame being positioned in the center thereof, and the actuator includes an upper-left actuator connected between the left-side connection section and an upper part of the outer frame, a lower-left actuator connected between the left-side connection section and a lower part of the outer frame, an upper-right actuator connected between the right-side connection section and the upper part of the outer frame, and a lower-right actuator connected between the right-side connection section and the lower part of the outer frame.

According to this configuration, since the actuator is constituted by four actuators, namely, the upper-left, the lower-left, the upper-right, and the lower-right actuators, by alternately applying voltages with reverse polarities to the upper-left and lower-left actuators and to the upper-right and lower-right actuators, the mirror can be vibrated around the first shaft section. In addition, by alternately applying voltages with reverse polarities to the upper-left and upper-right actuators and to the lower-left and lower-right actuators, the mirror can be vibrated around the second shaft section.

The invention claimed is:

1. An optical scanner comprising:
   a mirror;
   a first shaft section;
   a mirror frame that holds the mirror via the first shaft section;
   a second shaft section that holds the mirror frame; and
   an actuator that vibrates the mirror around the first and second shaft sections by vibrating the mirror frame via the second shaft section, wherein
   the second shaft section includes a deformable connection unit and is connected to the actuator via the connection unit, and
   the mirror frame includes an adjustment member for adjusting moment of inertia of the mirror frame with which the mirror is driven to vibrate at a resonant frequency by the actuator vibrating the mirror frame about the first shaft section, the adjustment member is provided on an extension of the second shaft section.

2. The optical scanner according to claim 1, wherein
   the mirror frame is weighted symmetrically about first shaft section, and
   the adjustment member is provided such that the mirror frame is weighted symmetrically about the first shaft section.

3. The optical scanner according to claim 2, wherein
   a direction of the first shaft section is perpendicular to a direction of the second shaft section.

4. The optical scanner according to claim 1, further comprising
   a base section constituted by a semiconducting material, wherein
   the actuator is constituted by a unimorph including a thin film of a piezoelectric element pasted on the base section,
   the adjustment member is constituted by a thin film of the same material as the piezoelectric element, and
   the mirror, the first shaft section, the mirror frame, and the second shaft section are constituted by the semiconducting material.

5. The optical scanner according to claim 1, wherein
   a part of the mirror frame is thicker than other parts, and
   the adjustment member is constituted by the part.

6. The optical scanner according to claim 1, wherein
   the mirror frame is horizontally symmetrical about the first shaft section and vertically symmetrical about the second shaft section, and has a shape that encloses the mirror.

7. The optical scanner according to claim 1, wherein the connection unit comprises a plurality of slits whose longitudinal direction coincides with a longitudinal direction of the second shaft section.

8. The optical scanner according to claim 1, further comprising
an outer frame that encloses the actuator, wherein
the connection unit is constituted by a pair of left and right connection sections, with the mirror frame being positioned in the center thereof, and
the actuator includes an upper-left actuator connected between the left-side connection section and an upper part of the outer frame, a lower-left actuator connected between the left-side connection section and a lower part of the outer frame, an upper-right actuator connected between the right-side connection section and the upper part of the outer frame, and a lower-right actuator connected between the right-side connection section and the lower part of the outer frame.

* * * * *